US008715910B2

(12) United States Patent
Temchenko et al.

(10) Patent No.: US 8,715,910 B2
(45) Date of Patent: May 6, 2014

(54) METHOD FOR EXPOSING AN AREA ON A SUBSTRATE TO A BEAM AND PHOTOLITHOGRAPHIC SYSTEM

(75) Inventors: Vlad Temchenko, Dresden (DE); Chinteong Lim, Dresden (DE); Jens Schneider, Moritzburg (DE); Yves Fabien Rody, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 1168 days.

(21) Appl. No.: 12/191,957

(22) Filed: Aug. 14, 2008

(65) Prior Publication Data
US 2010/0040987 A1 Feb. 18, 2010

(51) Int. Cl.
*G03F 7/20* (2006.01)
(52) U.S. Cl.
USPC ............................................. 430/311

(58) Field of Classification Search
USPC ............................................. 430/311
See application file for complete search history.

(56) References Cited

U.S. PATENT DOCUMENTS

| 2005/0094132 A1* | 5/2005 | Starikov et al. ............... 356/123 |
| 2007/0041003 A1 | 2/2007 | Ausschnitt et al. |
| 2008/0131796 A1* | 6/2008 | Werner et al. .................. 430/30 |

* cited by examiner

*Primary Examiner* — Kathleen Duda
(74) *Attorney, Agent, or Firm* — Slater & Matsil, L.L.P.

(57) ABSTRACT

Embodiments of the invention describe a method for exposing an area on a substrate to a beam. The method includes adjusting a focus offset of the beam with respect to the area on the substrate, tilting the beam or tilting the substrate, and exposing the area on the substrate with the beam, thereby generating locations within the area exposed with different foci. Furthermore embodiments describe computer programs for controlling a photolithographic system to do the same and a photolithographic system for doing the same.

19 Claims, 7 Drawing Sheets

One Measurement per exposure field

METHOD FOR EXPOSING AN AREA ON A SUBSTRATE TO A BEAM AND PHOTOLITHOGRAPHIC SYSTEM

TECHNICAL FIELD

Embodiments of the invention relate to lithography.

BACKGROUND

Lithography is used for exposing one or more areas on a substrate with a beam for defining in the exposed area one or more desired patterns.

BRIEF DESCRIPTION OF THE DRAWINGS

Embodiments according to the invention will be described subsequently taking reference to the enclosed drawings, in which.

DETAILED DESCRIPTION OF ILLUSTRATIVE EMBODIMENTS

With reference to the accompanying FIGS. 1 to 7, embodiments and explanations are given which relate to a method for exposing an area on a substrate to a beam, and a photolithographic system and computer programs for doing the same.

Embodiments according to the invention are directed to a method for exposing an area on a substrate to a beam. Such a beam may be a photolithographic beam, which is employed in a semiconductor fabrication process. The photolithographic beam can be a particle beam comprising, for example, atoms, ions, electrons, neutrons or protons, or an electromagnetic radiation, for example, in the visible, ultraviolet or X-ray spectral range. The area on a substrate may, for example, be a focus exposure field of a focus exposure matrix (FEM) on a wafer. The area may comprise measurable structures or measurement points. Such structures or measurement points may comprise critical dimension (CD) for a photolithographic process. In order to optimize such a photolithographic process a wafer may comprise multiple focus exposure fields, wherein a photo resist on top of the wafer is exposed under varying exposure conditions. The exposure of the photo resist can be a critical step for obtaining well defined structures for integrated circuits or semiconductor devices on a wafer. In order to receive an optimized image of a pattern or electrical circuit on the wafer a precise dose and focus must be chosen and adjusted. The dose may depend on the exposure time for the area on the substrate to be exposed and the intensity of the beam applied. By modifying such parameters systematically an optimized setting for a photolithographic process can be achieved. The quality of such an adjustable photolithographic process setting may therefore depend on the quality of focus exposure matrix. The quality of focus exposure matrix (FEM) depends on a number of focus exposure fields per wafer with varying focus/dose values. For large exposure fields, such focus exposure matrix analysis is limited and often requires more than one wafer. Using more wafers means using more production resources, such as resist (photo resist), tool time, and measurement time, which could all be spared by introducing sufficient focus-exposure analysis from a single or a reduced number of wafers. In other words there is a need to optimize the exposing of such a focus exposure matrix in order to determine optimized focus/dose values of a photolithographic process. A photolithographic system can be calibrated by adjusting such optimized focus/dose values determined by measured and respective calculated settings from a focus exposure matrix. As a consequence the photolithographic process and hence the quality of the semiconductor devices to be manufactured can be improved.

Figure 1:
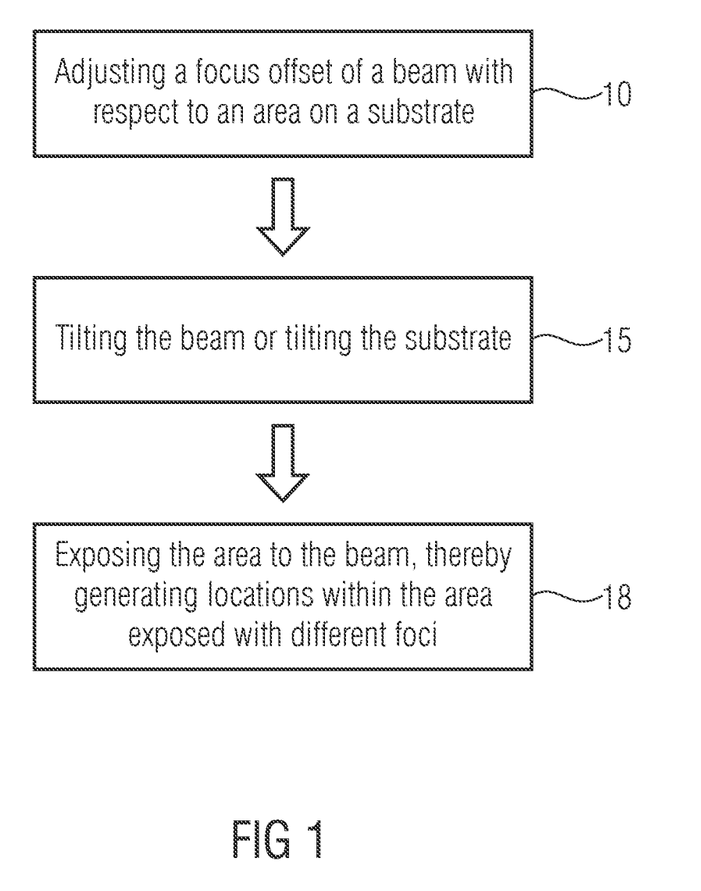
FIG. 1 shows a flow chart of a method for exposing an area on a substrate to a beam according to an embodiment of the invention.

FIG. 1 shows a flow chart of a method for exposing an area on a substrate to a beam according to an embodiment of the invention. The method comprises adjusting, in step 10, a focus offset of the beam with respect to an area of the substrate. The method also comprises tilting, in step 15, the beam or tilting the substrate and exposing, in step 18, the area of the substrate to the beam, thereby generating locations within the area exposed with different foci.

The area on a substrate may be the above mentioned focus exposure field of a FEM on a wafer. The wafer may be covered with a photo resist and such a focus exposure field may comprise a plurality of structures which are photo lithographically transferred with a photolithographic beam of a photolithographic system. Such a structure or measurement point may be transferred on the area by positioning a mask with an image of the structure in the photolithographic beam, so that a positive or negative image of the structure is transferred onto the area on the substrate during exposing, in step 18. The photolithographic system may be a system used for semiconductor processing and therefore the photolithographic beam may comprise electromagnetic radiation in the visible, ultraviolet or X-ray spectral range. It is also possible that the beam of the photolithographic system comprises a photolithographic beam source for emitting electrons, protons, neutrons, atoms or ions in order to structure or expose an area on the substrate. There may be a mask with a pattern or a structure positioned between the photolithographic beam source and the substrate, so that the pattern or the structure is photo lithographically transferred to the substrate during exposing. The substrate may be covered with a negative or positive photo resist. But it is also possible that the substrate comprises structures or patterns which can be exposed directly to the beam. The substrate can, for example, be a semiconductor wafer or glass wafer.

Adjusting, in step 10, a focus offset of the photolithographic beam may be performed with respect to the area of the substrate. That means, for example, the area may be covered with a photo resist and the focus offset may be adjusted with respect to the surface of the photo resist. The focus offset may be adjusted so that the focus of the beam is above the surface of the photo resist layer, on the surface of the photo resist layer or in the photo resist layer. That means the focus offset can be varied so that the focus is defocused on purpose and therefore varied. As a consequence, structures or patterns disposed on the area with varying focus offsets may, after developing the photo resist, comprise different dimensions for identical critical mask structures.

So far, for exposing a focus exposure matrix only one focus value is adjusted per focus exposure field. The area on a substrate, the focus exposure field respectively, may be defined by the exposure field, that means the area which can be exposed during one photolithographic exposure shot. By tilting either the beam or by tilting the substrate at least two different foci of the beam in the area on the substrate may be adjusted. That means an adjusted focus offset can be modulated by tilting the beam with respect, for example, to the surface normal of the area or by tilting the substrate with respect to the perpendicular incident beam. The focus offset can be modulated by tilting and therewith the number of different foci of the photolithographic beam in the area on the substrate can be varied. Depending on the tilting, in step 15, a continuous focus offset modulation can be achieved in the area. That means within a certain focus value range a continuous distribution of foci for the photolithographic beam of the photolithographic system can be generated in the area on the substrate. Compared to a conventional method for exposing such a focus exposure field, several measurement points per focus exposure field can be generated. In a conventional method for exposing a focus exposure matrix on a wafer, only one fixed adjusted focus value per focus exposure field may be obtained.

Exposing, in step 18, the area on the substrate to the photolithographic beam can be performed during a preset exposure time period. After exposing the area on the substrate, the area comprises at least two locations exposed with at least two different foci on the photolithographic beam. Compared to a conventional approach where only one discrete focus offset per focus exposure field and hence only one focus value may be adjusted, with a method according to embodiments of the invention the number of discrete focus values and therewith measurement points for optimizing a photolithographic process can be increased. As abovementioned, the exposed area on the substrate may comprise a continuous range of foci because of the modulation of the photolithographic beam. Thus a plurality of measurement points can be obtained for optimizing a photolithographic process. The invention may thereby take a novel approach to expose a focus exposure matrix by using existing exposure tools options of a photolithographic system. With the method described in embodiments of the invention it is possible to have a continuous focus offset across the wafer in order to allow more focus offset measurements than a number of exposure fields of the wafer.

The number of measurement points can be increased and therefore more measurements can be performed. The analysis of such measurements can be performed manually or by automatic tools, for example, optical scanners, which measure optically critical dimensions of the photo lithographically, transferred structures in the focus exposure fields after developing the wafer. By evaluating the exposed structures, important exposure parameter can be optimized and/or adapted to certain needs for the production of an integrated circuit or semiconductor device. The structures to be measured may be located in the kerf of a die and may be called kerf structures.

The increased number of measurement points can be achieved by essentially modulating focus offset by focus tilting. The tilting may be performed by tilting the photolithographic beam with respect to the area or by tilting the focus exposure matrix with respect to the incident photolithographic beam. For example, by considering six full exposure fields across a wafer, then in a conventional focus exposure matrix approach only six discrete focus offset values can be provided. For each focus exposure field a fixed focus offset is adjusted. However, by exposing the focus exposure matrix in a way as described in embodiments of the invention a continuous focus offset can be achieved and hence the number of measurable focus offset values is increased. The number of measurable focus offset values may only be limited by the number of measurement structures or measurement points per focus exposure field. A focus exposure field of a FEM can comprise a plurality of structures to be measured so that the number of possible measurement points may be only limited by the number of measurable structures imaged thereon during the exposure.

Exposing, in step 18, may be performed with a preset dose of the beam. The dose may depend on the intensity of the beam and the exposure time or exposure time period. The dose for an exposure may be the intensity of the beam multiplied by the exposure time.

According to another embodiment of the invention the method may comprise setting a dose for exposing, in step 18, the area of the substrate with the photolithographic beam. The setting of the exposure time may be performed before the exposure of the area on the substrate is employed. By setting a well-defined dose, the area of the substrate, which may be covered with photo resist, is exposed during a well defined time period to a photolithographic beam of a well defined intensity. This can practically be achieved by opening a shutter, which may be arranged between a photolithographic beam source and the area on the substrate, in the path of rays of the beam, so that during a set exposure time the photolithographic beam can expose the area and during another time the photolithographic beam can be blocked by the shutter. In another embodiment the setting of an exposure time is just performed by switching on the photolithographic beam source during the exposure time.

Figure 2:
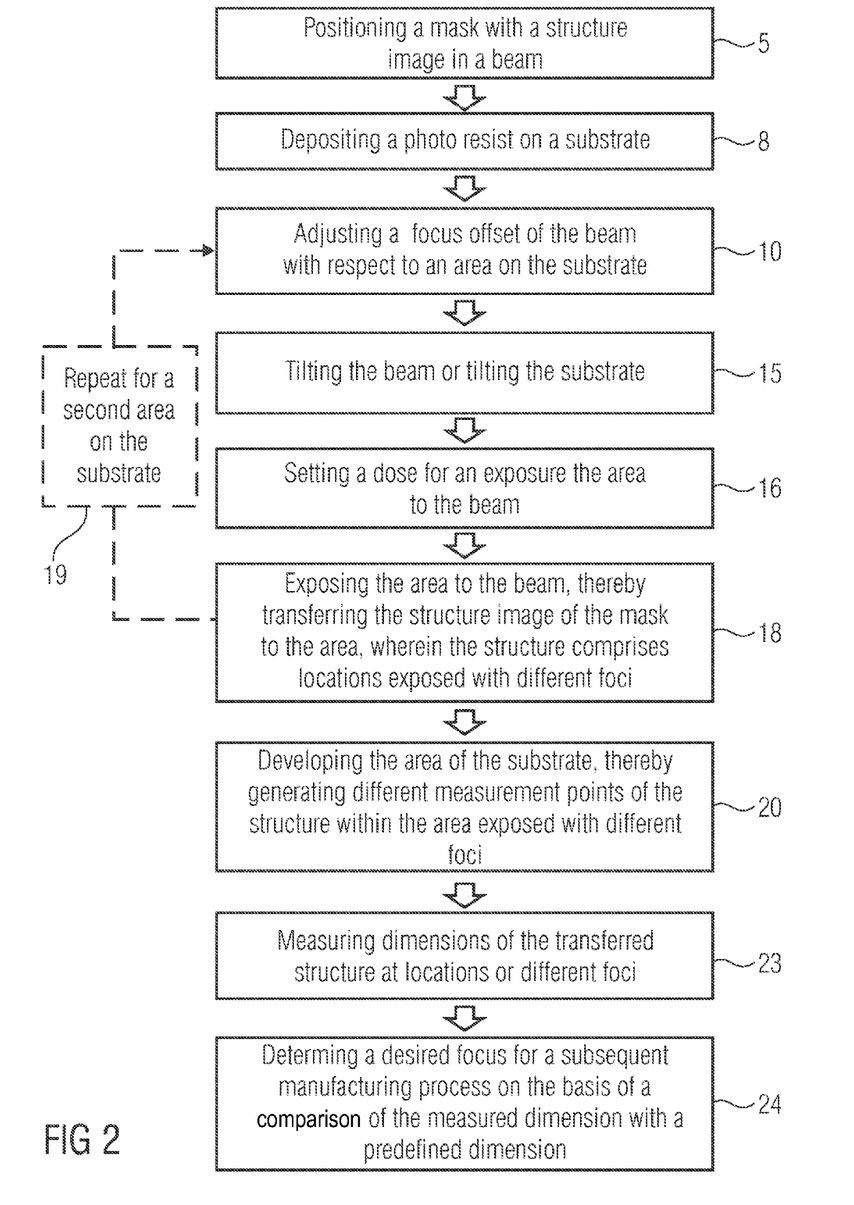
FIG. 2 shows another flow chart of a method for exposing an area on a substrate to a beam according to another embodiment of the invention.

FIG. 2 depicts another flow chart of a method for exposing an area on a substrate to a photolithographic beam of a photolithographic system. The method may further comprise positioning, in step 5, a mask with a structure image or a pattern in the photolithographic beam, so that a positive or negative image of the structure or the pattern is transferred onto the area on the substrate during exposing, in step 18. The method may also comprise depositing, in step 8, a positive or negative photo resist on the substrate to be exposed. The depositing, in step 8, may be performed so that the area on the substrate comprises photo resist before adjusting a focus offset and exposing the same with the photolithographic beam. After depositing a photo resist on the substrate, for example, on a semiconductor wafer, a focus offset for the photolithographic beam may be adjusted, in step 10, with respect to the surface of the photo resist on the wafer. The area to be exposed may be in this case the photo resist area on the substrate. The focus offset and a tilt angle may be, for example, adjusted with respect to the surface of this photo resist on the wafer. After or before adjusting a focus offset, as described above, the focus offset may be again modulated, in step 15, by tilting the photolithographic beam or by tilting the area on the substrate with respect to the incident photolithographic beam. In other words a tilt angle may be adjusted so that the beam and the area on the substrate mutually comprise a tilt angle different to 90°. The method may further comprise setting, in step 16, a dose for exposing the area on the substrate. For a certain exposure field a certain exposure dose can be set. The set of a dose can be performed before exposing the area of the substrate with the photolithographic beam. By exposing the area on the substrate with the beam, thereby locations are generated within the area, which are exposed with different foci. There may be at least two locations within the area, which are exposed with at least two different foci.

The method can further include developing, in step 20, the photo resist on the area on the substrate with the locations exposed with different foci. That means after developing the area on the substrate exposed in a way described above, the developed area may comprise at least two measurement points on one structure photo lithographically transferred. The structures may comprise critical dimensions with different dimensions although the critical dimensions on the mask structure image are identical. Among others, because of the different foci for the photolithographic beam the actual dimensions of the developed structures on the wafer may differ. For a desired value for a critical dimension in an integrated circuit, the exact focus/dose conditions for the respective photolithographic process can then be calculated from the measured varying dimensions of the developed structures. The sequence of positioning in step 5, depositing in step 8, adjusting in step 10 a focus offset, tilting in step 15 and setting a dose in step 16 may in other embodiments differ to the flow chart depicted in FIG. 2.

Depending whether the photo resist on the area of the substrate is a positive or a negative photo resist, the exposed areas or the unexposed are exposed can be removed during developing, in step 20. The developing, in step 20, may be performed by conventional means within a chemical reaction. Depending on the precise exposure conditions the photo resist may be more or less resistant against a chemical reaction and therefore critical dimensions of the structure exposed with different foci, may comprise different dimensions compared to each other. Furthermore the method may comprise measuring, in step 23, the dimensions of the transferred structure at the locations of different foci and determining, in step 24, a desired focus for a subsequent manufacturing process on the basis of a comparison of the measured dimensions with a predefined dimension.

According to an embodiment the method may be repeated, in step 19, in order to expose at least a second area on the substrate. For the repetition at least the tilting of the photolithographic beam or the tilting of the substrate with the area on the substrate may be modified. The area on the substrate may be a focus exposure field of a FEM on a wafer and therefore a tilt angle of the photolithographic beam or a tilt angle of the substrate may be modified compared to a second focus exposure field according to an embodiment of the invention. In addition the second focus exposure field may comprise a different focus offset and/or a setting for a different dose. In other words a substrate may comprise a second area to be exposed; and wherein adjusting in step 10, tilting in step 15 and exposing in step 18 is repeated for the second area, with one of the focus offset and tilt angle being modified, when compared to exposing the first area on the substrate. In a further embodiment, different doses for the beam to expose the first and the second area can be set.

According to embodiments of the invention tilting the focus offset may be performed by adjusting the photolithographic beam and the area on the substrate modularly so that a tilt angle between the photolithographic beam and the surface of the area is different than 90°. Referring to embodiments of the invention modulating the focus offset can mean tilting the photolithographic beam relative to the surface of the area or tilting the substrate relative to the incident photolithographic beam. In embodiments a tilt angle between the photolithographic beam and the surface of the area on the substrate without tilting the photolithographic beam or without tilting the substrate may comprise 90°.

In another embodiment of the invention the method is repeated in order to expose at least a second area on the substrate and wherein at least one of the focus offset, the tilting of the photolithographic beam or the tilting of the substrate and the dose is modified. The area on the substrate may be a focus exposure field on a wafer covered with photo resist. The method may be repeated in order to expose a plurality of focus exposure fields arranged in rows and columns on the wafer.

By modulating the focus offset and exposing the area on the substrate a number of locations in the area on the substrate exposed with different foci is higher than a number of locations exposed with different foci without modulating the focus offset by tilting the photolithographic beam or by tilting the substrate during an exposure shot. That means the number of locations or measurement points exposed with different foci in a focus exposure field can be increased by tilting the photolithographic beam compared to a conventional approach where a focus exposure field comprises only one discrete focus setting. For this reason more measurement points and therefore more detailed information about a photolithographic process can be obtained according to an embodiment of the invention.

Figure 3A:
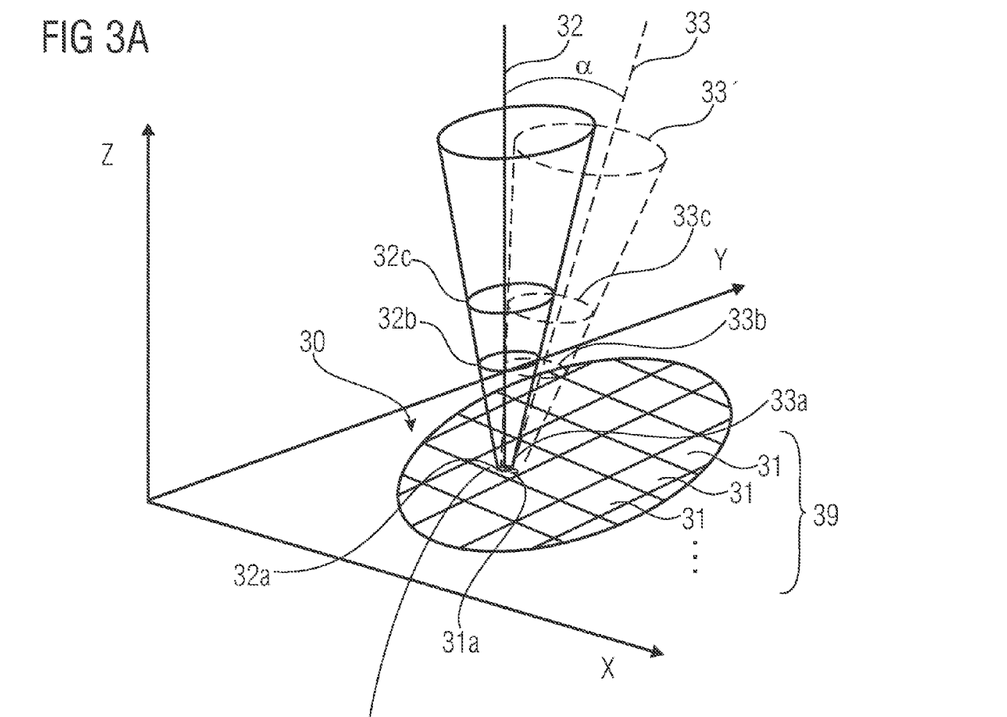
FIG. 3a shows a schematic drawing for adjusting a focus offset for a photolithographic beam on an area of a wafer and modulating the focus offset of the photolithographic beam by tilting the photolithographic beam with respect to the surface normal of the wafer.
Figure 3B:
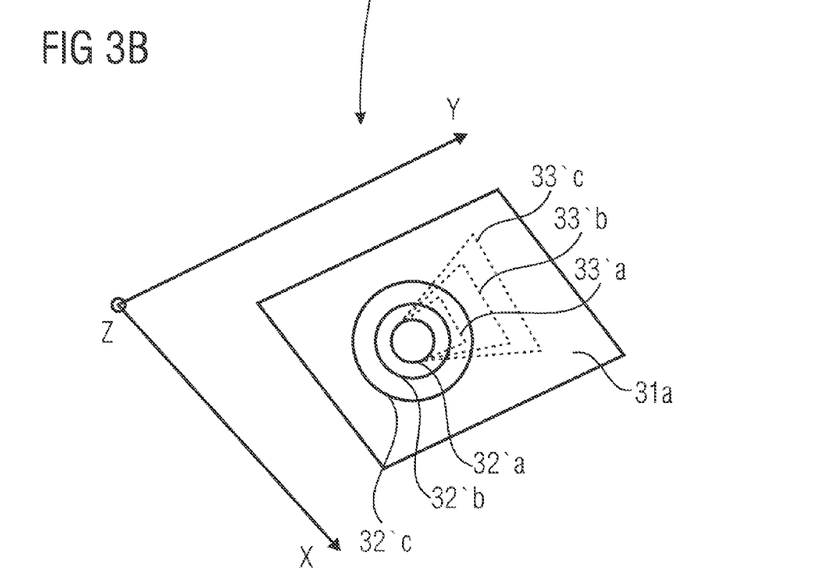
FIG. 3b shows a schematic enlargement of an exposed area on the wafer according to FIG. 3a with respectively adjusted and modulated foci offsets.

FIGS. 3a and 3b illustrate schematically tilting a photolithographic beam at a tilt angle α. In FIG. 3a a wafer 30 with a plurality of focus exposure fields 31 forming the focus exposure matrix 39 is depicted. The wafer may be arranged in the XY-plane of the system of coordinates depicted in FIG. 3a. The Z-coordinate may be perpendicular to the wafer 30, e.g., parallel to the incident photolithographic beam 32. For a better way to illustrate the modulation of the focus offset by tilting the photolithographic beam the tilt angle α is depicted and the tilted photolithographic beam 33. Depending on an adjusted focus offset the respective focus 32a, 32b and 32c may be represented by different foci spots 32a, 32b, 32c. Those foci spots may comprise different diameters. In this embodiment the incident photolithographic beam may be parallel to the surface normal of the wafer 30. That means the XY-plane with the wafer and the incident beam comprises an angle of 90°. An adjusted focus offset can now be modulated, for example, by tilting the incident photolithographic beam so that the tilted photolithographic beam 33 comprises an angle different to 90° with respect to the wafer. The tilted photolithographic beam may also comprise a cone like shape 33' with modulated focus offsets 33a, 33b and 33c.

FIG. 3b shows a schematical enlargement of the focus expose field 31a from FIG. 3a. Corresponding to the adjusted focus offset values 32a to 32c the focus exposure matrix may comprise three different foci spots 32'a to 32'c with different diameters. By tilting the photolithographic beam 33 a trapezoidal continuous range of different foci can be achieved. This is depicted by the trapezoids 33'a, 33'b and 33'c, which correspond to the focus offset values 33a to 33c. In other words by tilting the photolithographic beam for an adjusted focus offset a continuous modulation of the focus within the focus exposure field can be achieved.

It should be noted that during a real exposure process the whole focus exposure field will be exposed with a focus corresponding to the adjusted focus offset. The circles and trapezoids are just depicted for a better illustration in FIG. 3b.

Figure 4A:
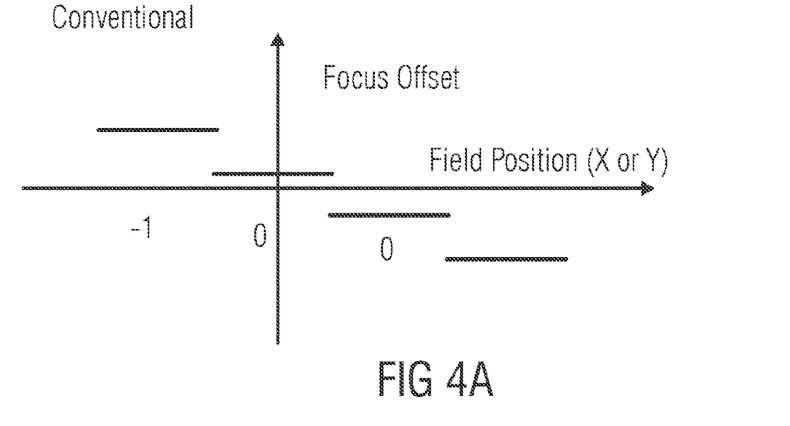
FIG. 4a shows a diagram of a conventional approach for adjusting a focus offset for focus exposure fields of a focus exposure matrix on a wafer.
Figure 4B:
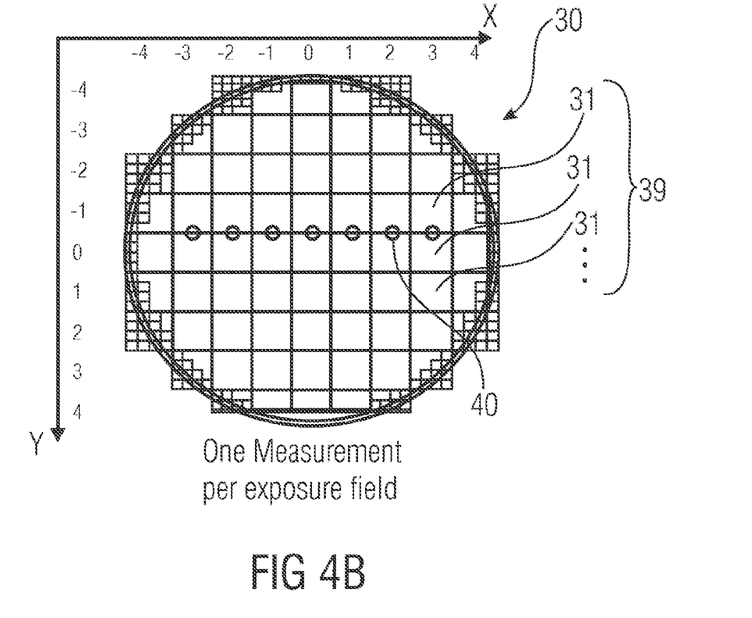
FIG. 4b shows a wafer map with a plurality of focus exposure fields of a focus exposure matrix exposed in a conventional way.
Figure 4C:
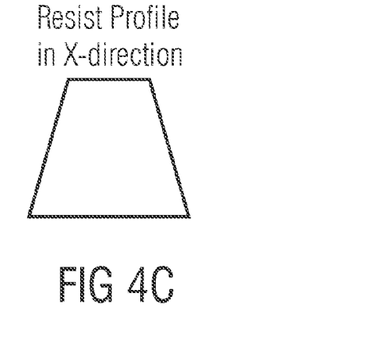
FIG. 4c shows schematically a conventional resist profile in an X-direction of the wafer map.
Figure 4D:
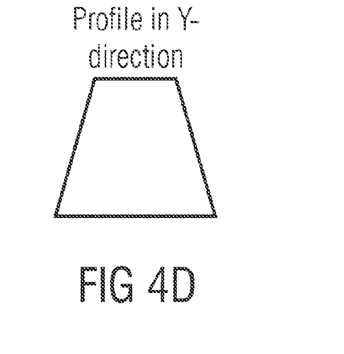
FIG. 4d shows schematically a conventional resist profile in a Y-direction of a wafer map.

FIGS. 4a to 4d show a conventional method of exposing a wafer with a plurality of focus exposure field in order to form a focus exposure matrix (FEM). As depicted in FIG. 4b a wafer 30 may comprise a plurality of focus exposure fields 31, which are arranged in rows and columns and which from together the FEM 39. A position of a certain focus exposure field is given by its corresponding X- and Y-coordinate (FIG. 4b). In a conventional approach for exposing a focus exposure matrix only one focus value per focus exposure field is adjusted by the respective adjusted focus offset. This is schematically shown in FIG. 4a. The focus offset is modified for one focus exposure field (X- or Y-field position). A focus offset for a certain focus exposure matrix field may be given with respect to the surface of a photo resist on top of the wafer. With this conventional approach only one measurement per exposure field 31 can be performed, which is illustrated with the measurement points 40. For a structure to be measured the photo resist profile in X- and Y-direction (see FIG. 4c, 4d) may be identical. The resist profile in X- and Y-direction may comprise a trapezoid-like shape.

Figure 5A:
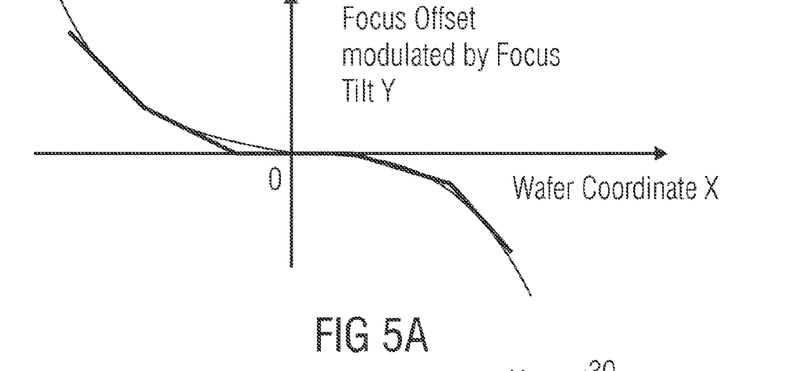
FIG. 5a shows a diagram of a continuous focus offset modulated by focus tilting in a Y-direction according to an embodiment of the invention.
Figure 5B:
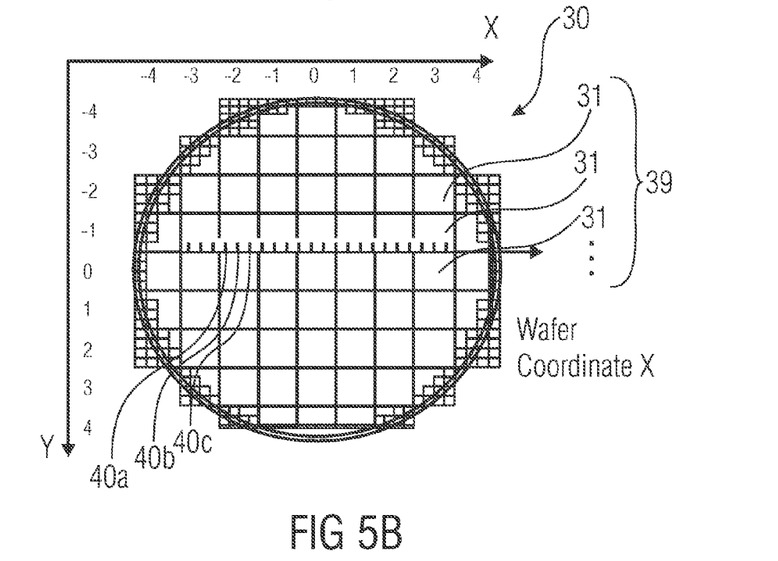
FIG. 5b shows a respective wafer map with a plurality of focus exposure fields, wherein the focus exposure fields comprise a plurality of measurement points.
Figure 5C:
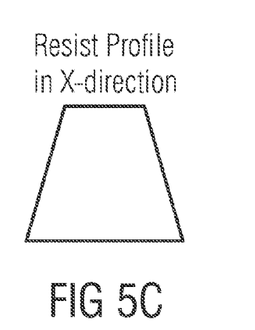
FIG. 5c shows the resist profile in an X-direction according to an embodiment of the invention.
Figure 5D:
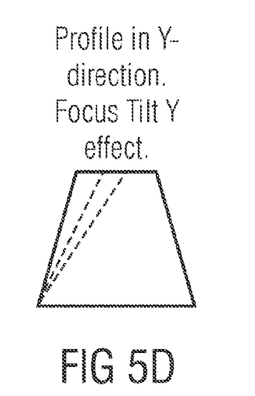
FIG. 5d shows schematically the resist profile in a Y-direction caused by tilting the focus in a Y-direction according to an embodiment of the invention.

FIGS. 5a to 5d show an embodiment according to the invention. In comparison to the preceding conventional method (FIG. 4a-d) a focus exposure matrix field 31 on a wafer 30 can now comprise a plurality of measurement points 40a to 40c according to an embodiment of the invention. The focus offset is in this embodiment modulated by a focus tilt in the Y-direction so that within one focus exposure matrix field 31a plurality of measurement points 40a-40c can be fabricated. If the method is repeated and the focus offset and/or the tilting is accordingly modified a continuous like focus offset across the focus exposure matrix on the wafer 30 can be achieved. This is schematically shown in FIG. 5a in the X-direction of the wafer coordinate. By tilting the focus offset in the Y-direction the resist profile for measuring the structure may be again trapezoid-like, as depicted in FIG. 5c, but may change by the focus tilt Y effect for the resist profile in the Y-direction (FIG. 5d). As a consequence of the tilting, an asymmetric resist profile in the Y-direction may be achieved, based on the different foci during exposure.

Figure 6:
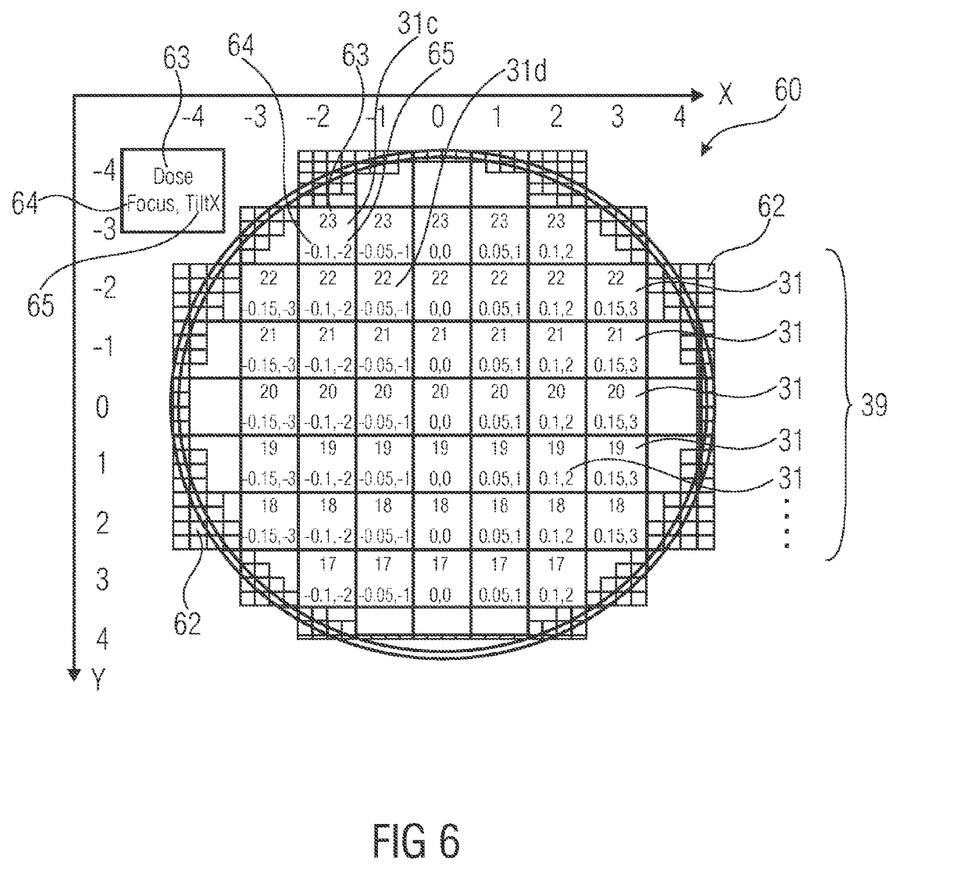
FIG. 6 shows another wafer map with a plurality of focus exposure fields according to an embodiment of the invention.

The wafer map 60 depicted in FIG. 6, illustrates another embodiment according to the invention, wherein the wafer map 60 comprises a plurality of focus exposure fields 31 forming the focus exposure matrix 39. Those exposure fields 31 are arranged in rows and columns. The coordinates of a focus exposure field is given by the corresponding X- and Y-coordinate. Each focus exposure field may comprise a plurality of dies 62, which are depicted at the edge of the wafer map 60. Each die can comprise several structures with dimensions to be measured or electrical circuits with corresponding structures to be measured. In this embodiment each focus exposure matrix field 31 has been exposed by varying at least one of the three parameters, the dose 63, the focus 64, or the tilt 65 (here in the X-direction). The focus exposure matrix 31c has been, for example, exposed with a dose of 23 (in arbitrary units). The focus offset is, for example, adjusted to −0.1 (in arbitrary units) and the tilt is, for example, adjusted to −2 (in arbitrary units). According to embodiments of the invention it is now possible to modify, in contrast to the abovementioned conventional approach three exposure parameters per focus exposure field of a focus exposure matrix. This is depicted for the focus exposure matrix field 31d, which comprises compared to the focus exposure field 31c three modified exposure parameters. Normally explorations in focus exposure matrix design are limited by exposure tool options. Common exposure tool options are limited to varying only two parameters within a matrix, for example, focus and exposure, or focus tilt and exposure, etc. According to this invention it is possible to expose an area on a substrate wherein three parameters are modified.

In another embodiment of the invention, a wafer may comprise a plurality of focus exposure fields, wherein at least one focus exposure field comprises at least two measurement points with different dimensions for a transferred identical mask dimension, indicating that the focus exposure matrix has been exposed with at least two different foci of a photolithographic beam. A focus exposure field may comprise at least a structure which can, for example, be transferred photo lithographically from a mask and wherein the structure may comprise a critical dimension transferred from the mask image and wherein the structure comprise two measurement points, wherein an identical critical mask dimension comprise different dimensions.

According to an embodiment of the invention, a wafer comprises a plurality of focus exposure fields, wherein at least one of the focus exposure fields comprises a plurality of measurement points with different dimensions for an identical mask image dimension, indicating that the focus exposure field has been exposed with a continuously varying focus of a photolithographic beam. In other words a focus exposure field may comprise a plurality of measurement points wherein each measurement point has been exposed with a different focus adjustment of a photolithographic beam. Because of the modulation of the focus offset by tilting the substrate or the photolithographic beam a continuously varying focus can be achieved in the focus exposure field.

A wafer may comprise a plurality of focus exposure fields, wherein each of the focus exposure fields comprises at least one measurable structure and wherein the measurable structure is formed with a positive or negative image of a mask image exposed with a photolithographic beam of a photolithographic system. Moreover, at least one of the focus exposure fields comprises a measurable structure with a critical mask dimension with at least two different dimensions indicating that the focus exposure field has been exposed with at least two different foci of the photolithographic beam of the photolithographic system.

In the embodiment depicted in FIG. 6, for example, horizontal critical dimensions should be measured at several sites or measurement points of an exposure field, and respective focus offset calculated from the measurement coordinate. In this embodiment the focus of the photolithographic beam at a point (X, Y) is a function of X-position, Y-position, focus offset and tilt in X-direction. In other words the focus and the location in the focus exposure matrix depends on the X- and Y-position on the wafer, the focus offset and the tilt of the photolithographic beam or the tilt of the focus exposure matrix on the wafer. After exposing and developing such a wafer, horizontal critical dimensions can be, for example, automated measured at several sites of an exposure field and depending on the measurement values a respective focus offset can be calculated from the measurement coordinates since the focus at a point (X, Y) is a function of X, Y, focus offset and tilt. Based on this information a photolithographic system can be calibrated or optimized for a photolithographic process.

By modifying three exposure parameters within one focus exposure field it is obvious, that the number of repetitions to get a predetermined number of measurement points is reduced compared to a conventional approach, which is limited to vary only two exposure parameters within a focus exposure field and hence within the focus exposure matrix.

In another embodiment of the invention, the method is repeated in order to expose at least a second area on a substrate. Such an area can be a second focus exposure field of a FEM. At the repetition of the exposure at least one of the focus offset, tilting of the photolithographic beam or tilting of the substrate is modified. Furthermore, the number of repetitions for exposing a predetermined number of measurement points in a focus exposure field, which are exposed with different foci is in this embodiment reduced compared to a conventional method, without modulating the focus offset of the photolithographic beam. According to another embodiment of the invention the method is performed so that the focus of the photolithographic beam at a location in the area on the substrate is depending on the adjusted focus offset and the tilt angle of the beam or substrate.

Figure 7:
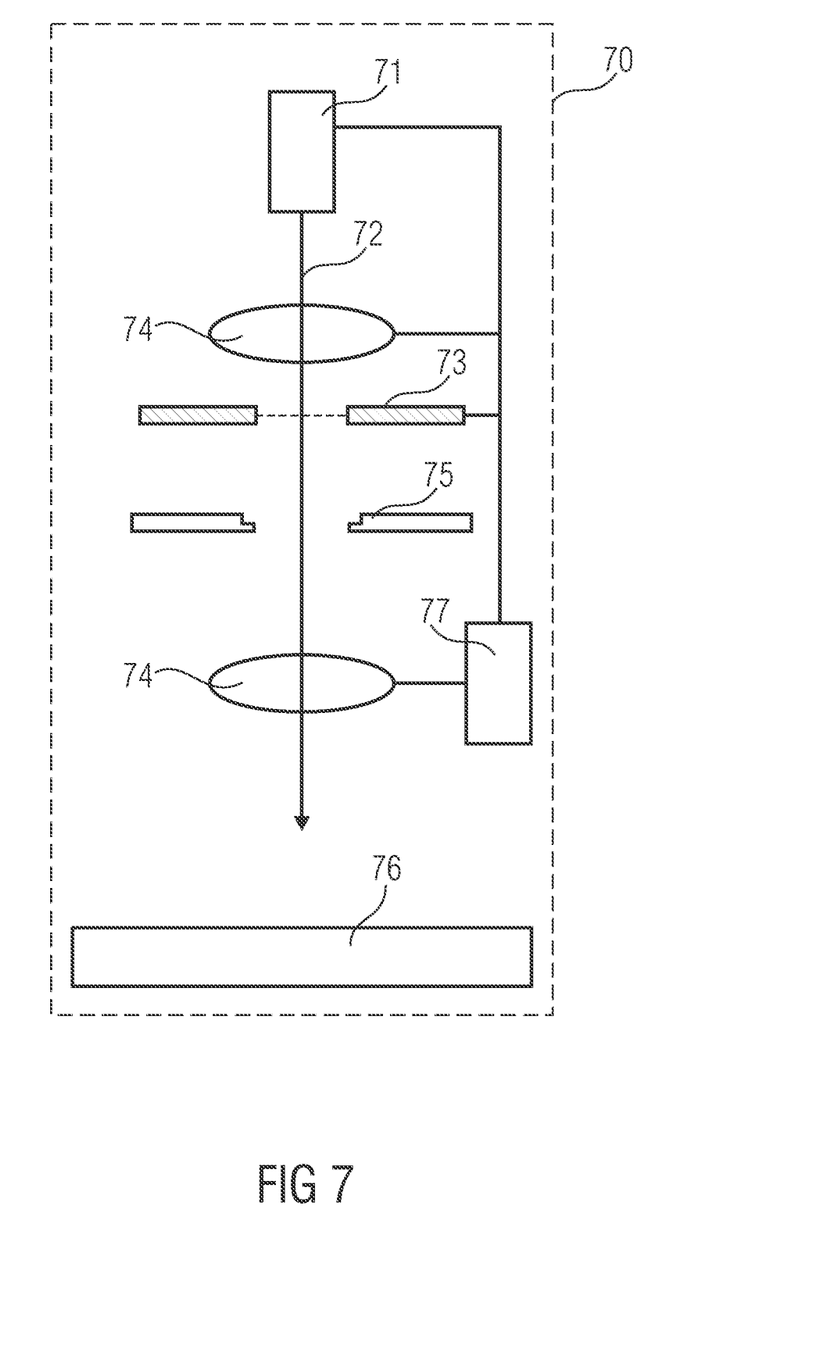
FIG. 7 shows a schematic drawing of a photolithographic system for exposing an area on a substrate to a beam according to an embodiment of the invention.

FIG. 7 shows a photolithographic system 70 which comprises a photolithographic beam source 71, wherein the photolithographic beam source is configured to emit a photolithographic beam 72 with an adjustable intensity for exposing an area on a substrate. The photolithographic system 70 comprises further a shutter 73, wherein the shutter is configured to block the photolithographic beam or let the photolithographic beam through so that an exposure time of the area on a substrate photolithographic beam is controllable. The photolithographic system 70 comprises further a lens-system 74, which is configured to image the photolithographic beam, emitted from the photolithographic beam source 71, on the area on the substrate. The lens-system may be an optical lens-system, but it is also possible, that the lens-system is an electro-optical or magnetic lens-system configured to diffract a particle beam, emitted by the photolithographic beam source 71. In general the lens-system may be configured to diffract and image the corresponding photolithographic beam emitted by the photolithographic beam source 71 on a substrate fixed on the chuck 76. The photolithographic system may further comprise a mask holder 75, wherein the mask holder is configured to support a mask or reticle so that a pattern on the mask/reticle can be photo lithographically transferred onto the area on the substrate and a chuck 76, wherein the chuck can be a movable chuck, which is configured to support and to move a substrate thereon. The system 70 may be controlled by a control unit 77. The control unit 77 may be configured to adjust the focus offset of the photolithographic beam and to modulate the focus offset by tilting the photolithographic beam or by tilting the chuck with the substrate thereon. As a consequence different foci of the photolithographic beam can be adjusted within the area of the substrate in one exposure shot. Moreover, the control unit may be configured to control the shutter and hence the exposure time for an exposure of the area on the substrate and the control unit 77 may be further be configured to control the intensity of the photolithographic beam. Therefore the control unit 77 may be configured so that a substrate, exposed with one exposure shot, comprises locations exposed with different foci of the photolithographic beam.

The control unit 77 is according to another embodiment of the invention further configured to move the chuck 76 to a different position, so that adjusting the focus offset, tilting the photolithographic beam or tilting the chuck with the substrate thereon and exposing the a second area on the substrate can be performed. Thereby one of the focus offset, exposure time, intensity and tilt angle is modified, when compared to an exposure of a first area on the substrate. In other words the control unit can be configured so that an exposure can be repeated automatically at a different area on the substrate, wherein one of the exposure parameters focus offset, focus tilt exposure time or beam intensity can be modified, compared to the exposure of the first area.

In another embodiment of the invention the control unit 77 of the photolithographic system 70 is configured to move a chuck to a different position, so that an exposure of a second area on the substrate is repeatable, wherein the focus offset, as well as a tilt angle and a dose, which is depending on the exposure time and the intensity of the photolithographic beam, is modified. That means the control unit 77 may be configured to modify the focus offset, the tilt angle and the dose for one exposure shot, compared to an exposure shot for a first area on the substrate.

In another embodiment of the photolithographic system 70 the control unit 77 is configured to expose a plurality of focus exposure fields of a focus exposure matrix on the wafer so that at least for one of the focus exposure fields a tilt angle of the photolithographic beam or a tilt angle of the focus exposure field with respect to the beam is modified, compared to other focus exposure fields of the focus exposure matrix on the wafer.

In embodiments of the invention a focus exposure matrix on a substrate can be extended by using a continuous focus offset modulated by a focus tilt. This method can be very effective for large area exposure fields. In embodiments of the invention the method can, for example, be used for all large chip logic/memory products. In embodiments of the invention the number of measurable focus offset values can be given by the number of structures per focus exposure field.

The method described in embodiments of the invention may be used for the fabrication of process window lots or "rainbow" lots for a semiconductor device or electrical circuits. For such lots, among others, the photolithographic process and hence also the exposure with the photolithographic beam may be modified on purpose, in order to optimize the semiconductor manufacturing process of the semiconductor device or to measure possible performance variations of the semiconductor device based on the manufacturing process. Hence those measurements may be crucial for the qualification of a semiconductor device.

In embodiments of the invention a method for exposing an area on substrate to a beam and a method for manufacturing at least two measurement points in a focus exposure field of a focus exposure matrix is performed by a computer program, which comprises a machine readable code or instructions to run a method according to embodiments described herein.

A computer program may comprise machine readable instructions for controlling a photolithographic system to expose an area on a substrate to a beam by adjusting a focus offset of the beam with respect to the area on the substrate. The computer program further comprises machine readable instructions for tilting the beam or tilting the substrate and for exposing the area on the substrate with the beam so that thereby locations within the area are generated, which are exposed with different foci.

According to another embodiment of the invention, a computer program comprises machine readable instructions for exposing different measurement points in one focus exposure field of a focus exposure matrix on a wafer to a photolithographic beam. The wafer may be covered with photo resist. The computer program comprises machine readable code or instructions to adjust a focus offset of a photolithographic beam with respect to the focus exposure field on the wafer. Furthermore the computer program comprises machine readable instructions to tilt the photolithographic beam or tilt the wafer relative to the photolithographic beam and to set a dose for exposing the focus exposure field on the wafer with the photolithographic beam. Moreover, the computer program may comprise machine readable instructions for exposing the focus exposure field on the wafer with the photolithographic beam, thereby generating different measurement points within the focus exposure field exposed with different foci.

While the foregoing has been particular described with reference to particular embodiments thereof, it will be understood by those skilled in the art that various other changes in the method, form and details may be made without departing from the spirit and scope thereof. It is to be understood that various changes may be made in adapting to different embodiments without departing from the broader concepts disclosed herein and comprehend by claims that follow.

What is claimed is:

1. A method for generating on a wafer a focus exposure matrix having a plurality of focus exposure fields, each focus exposure field including a plurality of structures, the method comprising:
    exposing each of the focus exposure fields for generating the plurality of structures;
    wherein the exposing comprises:
        adjusting a focus offset of a beam with respect to the focus exposure field on the wafer;
        tilting the beam or tilting the wafer;
        exposing the focus exposure field on the wafer to the beam, thereby generating locations within the focus exposure field exposed with different foci;
    wherein, starting from a focus exposure field exposed with no focus offset and no tilting, a first number of focus exposure fields exposed with increasing focus offset and tilting, and a second number of focus exposure fields exposed with decreasing focus offset and tilting are generated; and
    wherein tilting comprises adjusting the beam and the focus exposure field on the wafer mutually so that an angle between the beam and the focus exposure field on the wafer is different to 90°.

2. The method according to claim 1, wherein exposing comprises irradiating the focus exposure field of the wafer with the beam comprising electromagnetic radiation in a visible, ultraviolet or X-ray spectral range or irradiating the focus exposure field with an electron-, proton-, atom- or ion-beam.

3. The method according to claim 1, wherein the wafer is covered with photo resist, the method further comprising:
    developing the focus exposure field covered with photo resist, thereby generating the structures within the focus exposure field exposed with different foci.

4. The method according to claim 1, wherein exposing the focus exposure field generates a continuous range of different foci.

5. The method according to claim 1, further comprising:
    positioning a mask defining the structures, in the beam, so that a positive or negative image of the structures on the mask is transferred onto the focus exposure field on the wafer during exposing;
    measuring a dimension of the transferred structures at the locations of different foci; and
    determining a desired focus for a subsequent manufacturing process on the basis of a comparison of the measured dimension with a predefined dimension.

6. The method according to claim 1, wherein the focus exposure fields are arranged in rows and columns, and wherein for the focus exposure fields in different columns different doses of the beam for exposing the focus exposure fields are set.

7. A method for generating on a wafer a focus exposure matrix having a plurality of focus exposure fields, each focus exposure field including a plurality of structures, the method comprising:
    exposing each of the focus exposure fields for generating the plurality of structures;
    wherein the exposing comprises:
        adjusting a focus offset of a beam with respect to the focus exposure field on the wafer;
        tilting the beam or tilting the wafer;
        exposing the focus exposure field on the wafer to the beam, thereby generating locations within the focus exposure field exposed with different foci;
    wherein, starting from a focus exposure field exposed with no focus offset and no tilting, a first number of focus exposure fields exposed with increasing focus offset and tilting, and a second number of focus exposure fields exposed with decreasing focus offset and tilting are generated; and
    wherein exposing the focus exposure field generates a continuous range of different foci.

8. The method according to claim 7, further comprising:
    positioning a mask defining the structures, in the beam, so that a positive or negative image of the structures on the mask is transferred onto the focus exposure field on the wafer during exposing;
    measuring a dimension of the transferred structures at the locations of different foci; and
    determining a desired focus for a subsequent manufacturing process on the basis of a comparison of the measured dimension with a predefined dimension.

9. The method according to claim 7, wherein the focus exposure fields are arranged in rows and columns, and wherein for the focus exposure fields in different columns different doses of the beam for exposing the focus exposure fields are set.

10. The method according to claim 7, wherein exposing comprises irradiating the focus exposure field of the wafer with the beam comprising electromagnetic radiation in a visible, ultraviolet or X-ray spectral range or irradiating the focus exposure field with an electron-, proton-, atom- or ion-beam.

11. The method according to claim 7, wherein the wafer is covered with photo resist, the method further comprising:
    developing the focus exposure field covered with photo resist, thereby generating the structures within the focus exposure field exposed with different foci.

12. A method for generating on a wafer a focus exposure matrix having a plurality of focus exposure fields, each focus exposure field including a plurality of structures, the method comprising:
    exposing each of the focus exposure fields for generating the plurality of structures;
    wherein exposing comprises:
        adjusting a focus offset of a beam with respect to the focus exposure field on the wafer;
        tilting the beam or tilting the wafer;

exposing the focus exposure field on the wafer to the beam, thereby generating locations within the focus exposure field exposed with different foci;

wherein, starting from a focus exposure field exposed with no focus offset and no tilting, a first number of focus exposure fields exposed with increasing focus offset and tilting, and a second number of focus exposure fields exposed with decreasing focus offset and tilting are generated; and wherein the method further comprises:

positioning a mask defining the structures, in the beam, so that a positive or negative image of the structures on the mask is transferred onto the focus exposure field on the wafer during exposing;

measuring a dimension of the transferred structures at the locations of different foci; and determining a desired focus for a subsequent manufacturing process on the basis of a comparison of the measured dimension with a predefined dimension.

13. The method according to claim 12, wherein the focus exposure fields are arranged in rows and columns, and wherein for the focus exposure fields in different columns different doses of the beam for exposing the focus exposure fields are set.

14. The method according to claim 12, wherein exposing comprises irradiating the focus exposure field of the wafer with the beam comprising electromagnetic radiation in a visible, ultraviolet or X-ray spectral range or irradiating the focus exposure field with an electron-, proton-, atom- or ion-beam.

15. The method according to claim 12, wherein the wafer is covered with photo resist, the method further comprising:

developing the focus exposure field covered with photo resist, thereby generating the structures within the focus exposure field exposed with different foci.

16. A method for generating on a wafer a focus exposure matrix having a plurality of focus exposure fields, each focus exposure field including a plurality of structures, the method comprising:

exposing each of the focus exposure fields for generating the plurality of structures;

wherein exposing comprises:

adjusting a focus offset of a beam with respect to the focus exposure field on the wafer;

tilting the beam or tilting the wafer;

exposing the focus exposure field on the wafer to the beam, thereby generating locations within the focus exposure field exposed with different foci;

wherein, starting from a focus exposure field exposed with no focus offset and no tilting, a first number of focus exposure fields exposed with increasing focus offset and tilting, and a second number of focus exposure fields exposed with decreasing focus offset and tilting are generated;

wherein the focus exposure fields are arranged in rows and columns, and wherein for the focus exposure fields in different columns different doses of the beam for exposing the focus exposure fields are set.

17. The method according to claim 16, wherein exposing comprises irradiating the focus exposure field of the wafer with the beam comprising electromagnetic radiation in a visible, ultraviolet or X-ray spectral range or irradiating the focus exposure field with an electron-, proton-, atom- or ion-beam.

18. The method according to claim 16, wherein the wafer is covered with photo resist, the method further comprising:

developing the focus exposure field covered with photo resist, thereby generating the structures within the focus exposure field exposed with different foci.

19. A method for exposing an area on a substrate to a beam comprising:

adjusting a focus offset of the beam with respect to the area on the substrate;

tilting the beam or tilting the substrate;

exposing the area on the substrate to the beam, thereby generating locations within the area exposed with different foci, wherein the exposing comprises irradiating the area of the substrate with the beam comprising electromagnetic radiation in a visible, ultraviolet or X-ray spectral range or irradiating the area with an electron-, proton-, atom- or ion-beam, wherein the tilting comprises adjusting the beam and a focus exposure field on the substrate mutually so that an angle between the beam and the focus exposure field on the substrate is different to 90°.

* * * * *